United States Patent
Yen

(10) Patent No.: US 9,472,513 B2
(45) Date of Patent: Oct. 18, 2016

(54) TRANSMISSION LINE FOR 3D INTEGRATED CIRCUIT

(71) Applicant: Taiwan Semiconductor Manufacturing Co., Ltd., Hsin-Chu (TW)

(72) Inventor: Hsiao-Tsung Yen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 344 days.

(21) Appl. No.: 14/049,516

(22) Filed: Oct. 9, 2013

(65) Prior Publication Data

US 2015/0097640 A1    Apr. 9, 2015

(51) Int. Cl.
*H01P 3/08* (2006.01)
*H01L 23/66* (2006.01)

(52) U.S. Cl.
CPC ............ *H01L 23/66* (2013.01); *H01P 3/082* (2013.01); *H01P 3/088* (2013.01); *H01L 2924/0002* (2013.01)

(58) Field of Classification Search
CPC ......... H01L 23/66; H01P 3/082; H01P 3/088
See application file for complete search history.

(56) References Cited

U.S. PATENT DOCUMENTS

| 6,525,407 | B1 * | 2/2003 | Drewery ............ H01L 21/4846 257/666 |
| 8,912,581 | B2 * | 12/2014 | Lin ..................... H01L 23/5222 257/259 |

OTHER PUBLICATIONS

Chen, E. et al., "Characteristics of Coplanar Transmission Lines on Multilayer Substrates: Modeling and Experiments", IEEE Transactions on Microwave Theory and Techniques, Jun. 1997, 45(6):939-945.

* cited by examiner

*Primary Examiner* — Hai L Nguyen
(74) *Attorney, Agent, or Firm* — Duane Morris LLP

(57) ABSTRACT

A semiconductor transmission line substructure and methods of transmitting RF signals are described. The semiconductor transmission line substructure can include a substrate; a first signal line over the substrate; a first ground line over the substrate; and a second semiconductor substrate over the substrate. The first signal line, the first ground line and the second semiconductor substrate are each vertically spaced apart from one another and can be separated from one another by at least one electrically insulating layer.

20 Claims, 10 Drawing Sheets

TRANSMISSION LINE FOR 3D INTEGRATED CIRCUIT

TECHNICAL FIELD

The disclosure relates to semiconductor structures, and more particularly to transmission lines for semiconductor structures and methods of using the same.

BACKGROUND

Semiconductor packages equipped with wireless data and communication systems incorporate various RF (radio frequency) transmitting structures, which sometimes are built on-chip. RF signals are generally considered to have a frequency falling in approximately the 3 kHz to 300 GHz range, with frequencies in the domain between about 300 MHz (0.3 GHz) and 300 GHz typically being referred to as microwaves. Electromagnetic RF waves or signals are conveyed through the semiconductor packages or devices by conductive structures referred to as "transmission lines." Transmission lines, as an example, are used for interconnecting individual electrical elements together within an integrated circuit (IC) or MultiChip Module.

In general, a transmission line structure generally includes at least two electric conductors or lines, where one of the lines forms a ground line (also referred to as "ground plane") and the other forms a signal line. The signal line is variously arranged and combined with one or more ground planes or ground lines to form different types of conductive transmission line structures such as microstrips, striplines, and waveguides to serve various RF signal applications. The signal lines and ground lines are generally supported and separated by some type of insulating substrate or material, such as a dielectric.

As semiconductor technology continues to advance and chip package size shrinks, the distance between metal layers in the conductive CMOS (complementary metal-oxide semiconductor) structure becomes smaller resulting in increasingly larger capacitance between the metal layers which compromises performance of RF devices.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 4(a) is a cross-sectional view of a fourth transmission line substructure in accordance with other embodiments, while

DETAILED DESCRIPTION

The disclosure provides transmission lines incorporated into semiconductor structures, such as 3-D integrated circuits (3D IC). In some embodiments, the structure includes a transmission line and a ground plane above a first semiconductor substrate, and a second, semiconductor substrate that provides improved control over shielding and impedance of signals propagating through the transmission line. In some embodiments, the shielding and impedance can be varied using switches that couple or decouple multiple signal lines or ground lines. The transmission lines described herein can be small and are compatible with advanced integrated circuit technologies.

FIGS. 1-8 show lateral cross-sections of semiconductor substrates as described herein. As shown in FIGS. 1-8, the semiconductor transmission line substructures 10 described herein can include a first substrate 12; a first signal line 14 over the first semiconductor substrate 12 (referred to as "first substrate," for brevity); a first ground line 16 over the first substrate 12; and a second semiconductor substrate 18 (referred to as "second substrate," for brevity) over the first substrate 12. Each of the first substrate 12, first signal line 14, the first ground line 16 and the second substrate 18 are vertically spaced apart from one another. FIGS. 4-8 show substructures that also include a second signal line 22, a second ground line 24, or both.

In some embodiments, the second substrate 18 is included as part of a "stacked CMOS" 3D IC. In the stacked CMOS configuration, a second substrate 18 thinner than the first substrate 12 is bonded over the top metal layer of the interconnect structure of the first substrate. In some embodiments, the dielectric layer includes a glue oxide layer that joins the second substrate 18 to the dielectric layer 20. In some embodiments, one or more devices (not shown) on the first substrate 12 are connected to one or more devices, lines or vias (not shown) above the second substrate 18 by inter-level vias (ILV) (not shown), also referred to as "inter-tier vias". In other embodiments, the second substrate 18 is included in a second integrated circuit die, which is fabricated separately and joined to the first substrate 12, with through substrate vias (TSV) (not shown) connecting one or more devices in the substrate 12 with one or more devices in the second substrate 18.

Figure 4A:
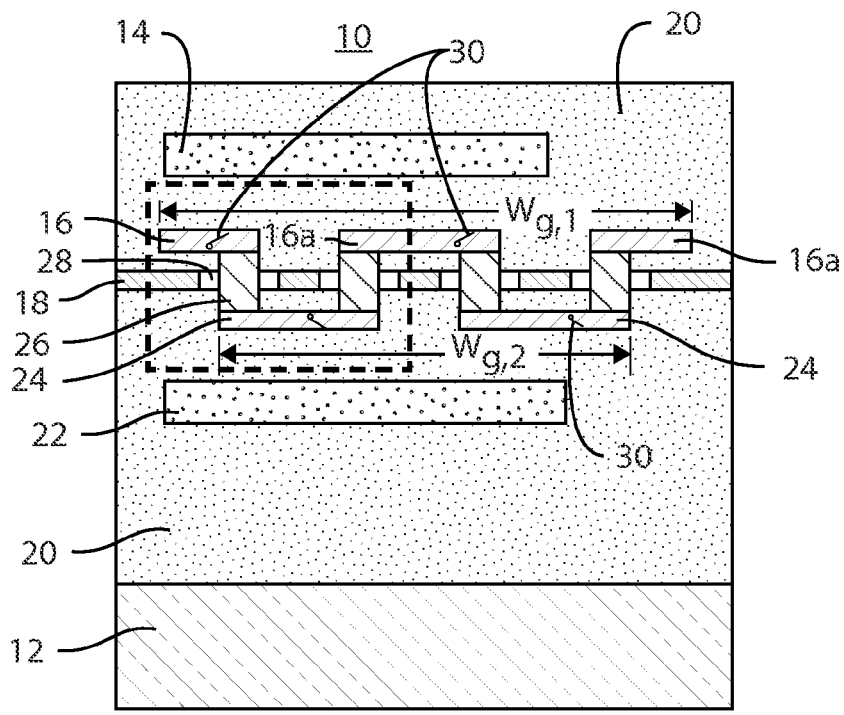

In some embodiments, the first signal line 14, the first ground line 16, the second substrate 18, the second signal line 22 and the second ground line 24 can be separated from each another by at least one electrically insulating layer 20. The electrically insulating layer prevents a conductive path from being formed between the structures of interest (e.g., the first signal line 14, first ground line 16, second substrate 18, second signal line 22, second ground line 24). In some embodiments, two elements can be separated by an electrically insulating layer 20 but also be coupled by a conductive via 26 or other similar structure. For example, the first and second ground lines 16, 24 in FIG. 4(a) are separated by an electrically insulating layer 20.

In some embodiments, an electrically insulating layer 20 can be formed exclusively from dielectric materials. However, in other embodiments, an electrically insulating layer 20 separating the two structures (e.g., a first signal line 14 and a first ground line 16) can include circuitry and conductive traces/routings. Examples of circuitry and conductive interconnect structures that can be included in the electrically insulating material include, but are not limited to, contact, vias, trenches, plugs and gate electrodes. The interconnect structures can comprise electrically conductive materials, which include, but are not limited to, copper, aluminum, tungsten, titanium and alloys thereof.

The signal lines 14, 22 and the ground lines 16, 24 can include a conductor (i.e., conductive material). The conductor can include, but is not limited to, copper, aluminum, tungsten, titanium and alloys thereof. In some embodiments, the signal lines and ground lines are formed by a damascene process, including forming a trench; depositing a diffusion barrier (e.g., Nickel, Nichrome, tantalum, hafnium, niobium, zirconium, vanadium, tungsten, tantalum nitride, indium oxide, copper silicide, tungsten nitride, or titanium nitride) on the walls and bottom of the trench; and bulk filling the trench with the conductive material.

In some embodiments, the first signal line 14 can be coupled to a signal source. Examples of signal sources include, but are not limited to, transmitters, receivers, voltage controlled oscillators, phase-locked loops, or an application specific integrated circuit.

In some embodiments, the width ($W_G$) of the first ground line 16 is about two or more times a width ($W_{sig}$) of the first signal line 14. In other embodiments, the width ($W_g$) of the first ground line 16 is about three times or more, or about four times or more than the width ($W_{sig}$) of the first signal line 14. In some embodiments, the width ($W_{sub}$) of the second substrate 18 is larger than the width ($W_g$) of the first ground line 16, while the second substrate width ($W_{sub}$) is at least 125%, or at least 150%, or at least 175% or at least 200% as wide as the first ground line width ($W_g$). These width ratios are also applicable to the widths of the second signal line 22 and the second ground line 24. The width ratio for the first signal line 14 and first ground line 16 can be independent from or the same as the width ratio of the second signal line 22 and the second ground line 24.

In some embodiments, the width ($W_{sig}$) of the signal lines 14, 22 can range from 4 to 40 μm. In some embodiments, the width ($W_{sub}$) of the second substrate 18 can range from 10 to 100 μm. In some embodiments, the width ($W_g$) of the ground lines 16, 24 can range from 6 to 100 μm, or 6 to 60 μm or even 10 to 100 μm.

In some embodiments, the vertical distance between the first and second substrates 12, 18 can be 4 μm of less, and can be 3 μm or less in other embodiments. In some embodiments, the vertical distance between the first and second substrates 12, 18 can be at least 1 μm, and can be at least 1.5 μm in other embodiments.

In some embodiments, the vertical distance between the second substrate 18 and the first signal line 14 and/or the second substrate 18 and the second signal line 22 can independently be at least 0.15 μm, and can independently be at least 0.3 μm in other embodiments. In some embodiments, the vertical distance between the second substrate 18 and the first signal line 14 and/or the second substrate 18 and the second signal line 22 can independently be 3 μm or less, and can independently be 2 μm or less in other embodiments.

In some embodiments, the vertical distance between the second substrate 18 and the first ground line 16 and/or the second substrate 18 and the second ground line 24 can independently be at least 0.15 μm, and can independently be at least 0.3 μm in other embodiments. In some embodiments, the vertical distance between the second substrate 18 and the first ground line 16 and/or the second substrate 18 and the second ground line 24 can independently be 3 μm or less, and can independently be 2 μm or less in other embodiments.

The signal lines 14, 22, ground lines 16, 24, and second substrate 18 can be generally shaped as polygonal solids, such as rectangular solids. In some embodiments, the longitudinal length of these transmission line structures (12, 14, 16, 18, 22, 24) is much larger than the width of the transmission line structures (12, 14, 16, 18, 22, 24). For example, the length of each of the transmission line structures (12, 14, 16, 18, 22, 24) can independently be 10 or more times their width, at least 20 times their width or at least 30 times their width.

As shown in FIG. 4, in some embodiments, the first ground line 16 can include a plurality of first ground line segments 16a that are laterally separated from, and collinear and co-planar with one another. In such embodiments, the first ground line width ($W_g$) is the longest distance from one end on a first ground line segment 16a to an opposing end of another first ground line segment 16a.

Figure 6:
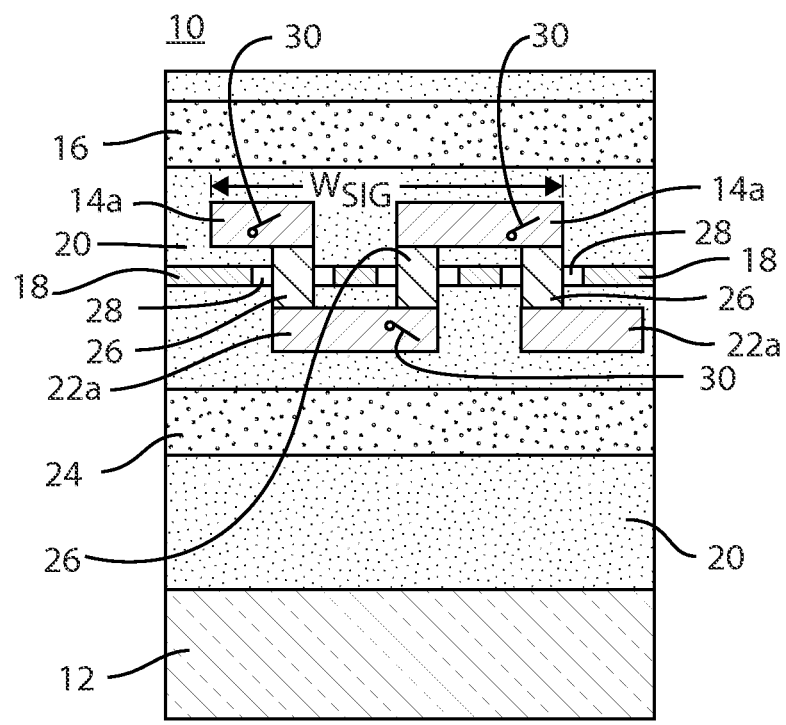
FIG. 6 is a cross-sectional view of a sixth transmission line substructure in accordance with other embodiments.

As shown in FIG. 6, in some embodiments, the first signal line 14 can include a plurality of first signal line segments 14a that are laterally separated from and collinear and co-planar with one another. In such embodiments, the first signal line width ($W_{sig}$) is the longest distance from one end on a first signal line segment 14a to an opposing end of another first signal line segment 14a.

In some embodiments, the substrate 12 comprises crystalline silicon, while the substrate 12 comprises other suitable materials in other embodiments.

In some embodiments, the second substrate 18 comprises a semiconductor material. Examples of semiconductor materials that can be used to form the second substrate 18 include, but are not limited to, Si, SiGe, Ge, GaAs and SiC. The use of semiconductor materials having the relative width and dielectric constants described above produces capacitive coupling between the first signal line 14 and the second substrate 18, which has the impact of slowing the wave propagation through the first signal line 14. In some embodiments, the thickness of the second substrate 18 can be in a range from about 50 nm to about 200 nm. A slower wave propagation speed allows the integrated circuit designer to use smaller transmission lines 10 while transmitting signals having the frequency of larger transmission lines (not shown). In addition, the second substrate 18 provides enhanced shielding and control over impedance and other transmission properties of the signal line.

Figure 1:
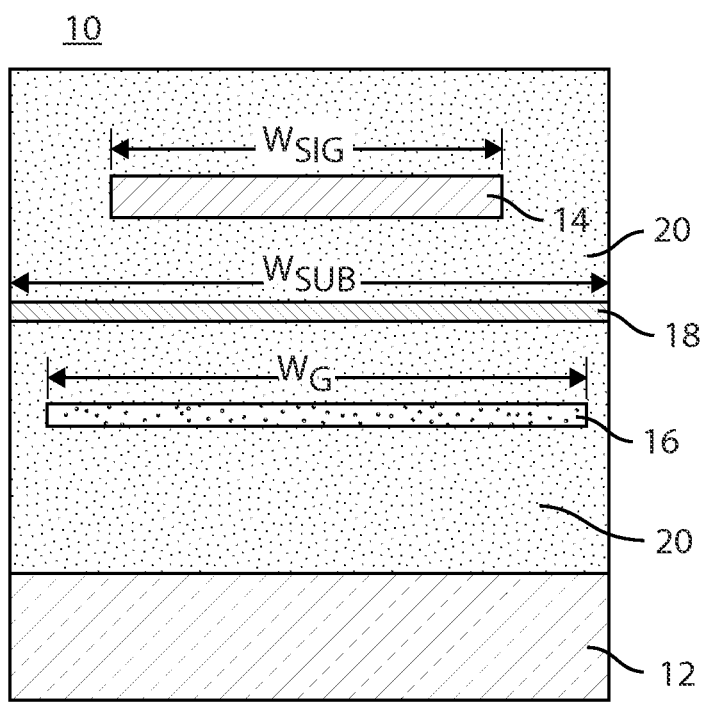
FIG. 1 is a cross-sectional view of a first transmission line substructure in accordance with some embodiments.
Figure 2:
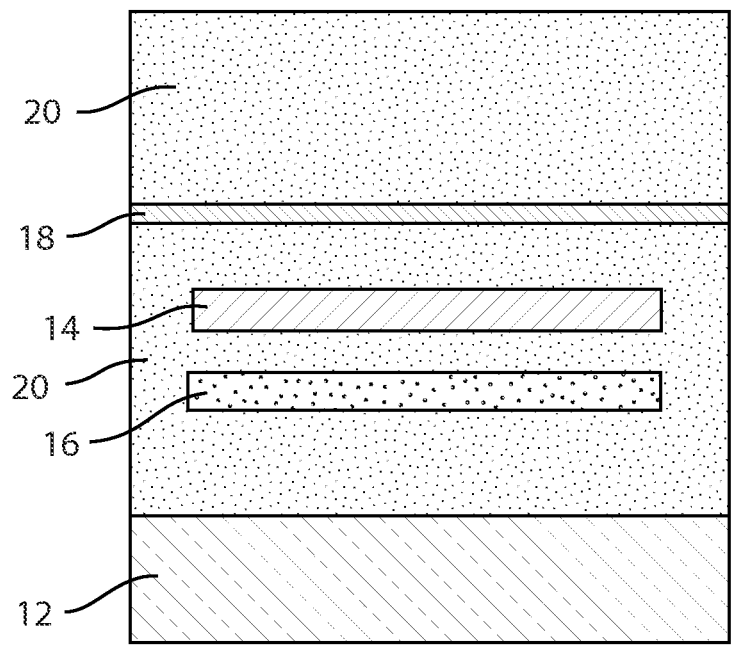
FIG. 2 is a cross-sectional view of a second transmission line substructure in accordance with some other embodiments.
Figure 3:
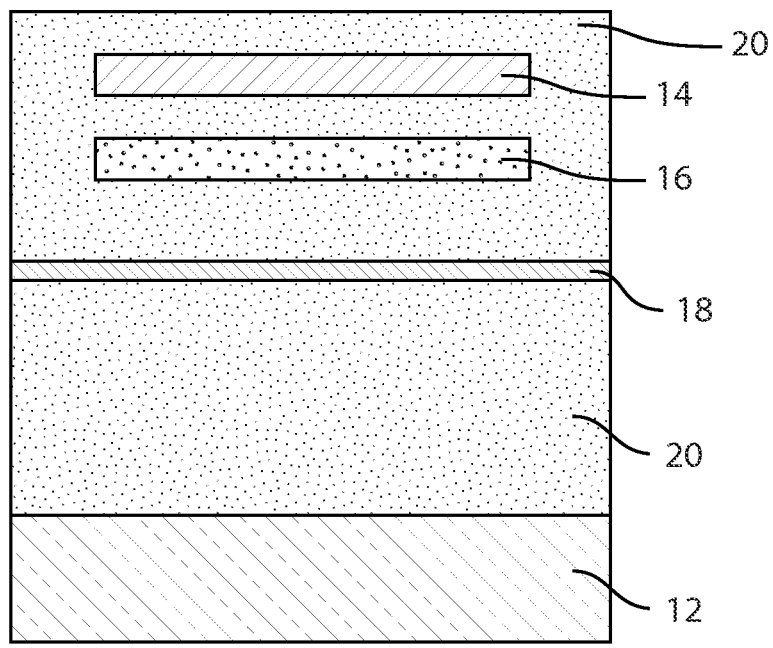
FIG. 3 is a cross-sectional view of a third transmission line substructure in accordance with still other embodiments.

As shown in FIG. 1, in some embodiments, the second substrate 18 can be located between the first signal line 14 and the first ground line 16. As shown in FIG. 2, in some embodiments, the second substrate 18 is located over the first signal line 14 and the first ground line 16. As shown in FIG. 3, in some embodiments, the first signal line 14 and the first ground line 16 are both located over said the second substrate 18. In the embodiments of FIGS. 2 & 3, the signal line 14 can be between the ground line 16 and the second substrate 18, or the ground line 16 can be between the signal line 14 and the second substrate 18.

Figure 5:
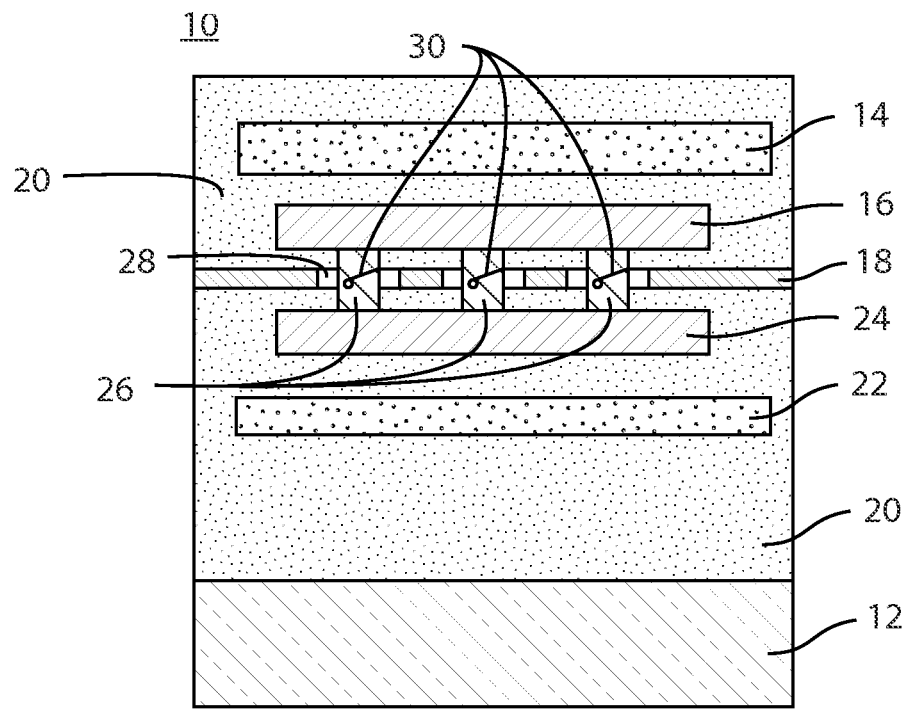
FIG. 5 is a cross-sectional view of a fifth transmission line substructure in accordance with yet other embodiments.

As shown in FIGS. 4(a) and 5, in some embodiments, the transmission line substructure 10 can include a second ground line 24 over the substrate 12, a second signal line 22 over the substrate 12, or both. In some embodiments, the second substrate 18 is between the first and second ground lines 16, 24, and the first ground line 16 is between the first signal line 14 and the second substrate 18. In some embodiments, such as those shown in FIGS. 4(a) and 5, the first and second ground lines 16, 24 are between the first and second signal lines 14, 22.

Figure 4B:
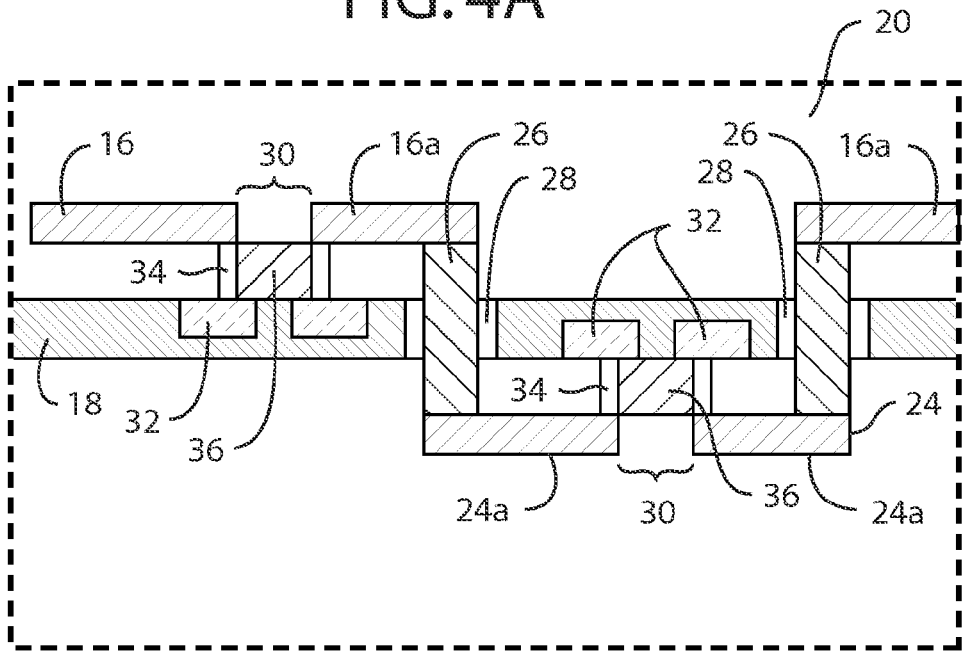
FIG. 4(b) is a close-up of the transmission line substructure of FIG. 4(a)

As shown in FIGS. 4(a) and 5, in some embodiments the first ground line 16 and the second ground line 24 are electrically coupled. For example, as best shown in FIG. 4(b), the first ground line 16 and the second ground line 24 can be coupled by a conductive via 26 that passes through the second substrate 18. In order to prevent a short circuit, a substrate dielectric 28 can separate the second substrate 18 from the conductive via 26.

In some embodiments, the electrical coupling between the first ground line 16 and the second ground line 24 can be interruptible. For example, as shown in FIGS. 4(a) and 4(b), a portion of a ground line segment 16a or 24a can be joined together by a switch 30. When the switch 30 is closed, the first ground line segment 16a is electrically coupled to the adjacent second ground line segment 24a by a conductive via 26. However, when the switch 30 is open, the first ground line segment 16a is not electrically coupled to the second ground line segment 24a.

Examples of switches include, but are not limited to, transistors, such as those shown in detail in FIG. 4(b), or a transmission gate (not shown) or diodes. Although switches 30 are shown both at an end of a ground/signal line segment 14a, 16a, 22a, 24a and along the conductive via 26, it will be understood that either position would provide a similar function and, unless stated otherwise, either arrangement can be represented by the switch symbol used in the Figures. As shown in FIG. 4(b), in some embodiments, the switches 30 are transistors, and portions of the switch 30, such as the source/drain diffusions regions 32 are formed in the surface of the second substrate 18, while elements such as electrical contacts 34, the gate insulating layer (not shown) and the gate electrode 36 are formed above the surface of the second substrate 18. The source/drain regions 32 can comprise a stressor material having a different lattice structure than the second substrate 18, such as SiGe or SiN in some embodiments, and other suitable materials in other embodiments. The electrical contacts 34 can be tungsten, copper or aluminum in some embodiments, and any other suitable material in other embodiments. The gate electrode 36 can be polycrystalline silicon ("poly") in some embodiments, or a high-k metal gate material or other suitable material in other embodiments. A thin gate insulating layer (e.g., a gate oxide layer, not shown) is provided between metal/poly gate 36 and substrate 18. Application of a bias voltage on the gate electrode 36 induces formation of a channel on the substrate 18. A change to the bias voltage on the gate turns the switch on or off.

For purposes of this disclosure, where portions of a ground line segment 16a, 24a are connected by a switch 30 (as in FIG. 4(a)), the ground line segment 16a, 24a includes the portions of the ground line segment 16a, 24a coupled to each side of the switch 30. As used herein, electrically coupled is intended to include embodiments where components are permanently, electrically coupled and embodiments where components are interruptibly, electrically coupled.

In some embodiments, the first ground line 16 includes a plurality of first ground line segments 16a, wherein the first ground line segments 16a are laterally separated from and co-planar with one another. As shown in FIGS. 4(a) and (b), in some embodiments the first ground line segments 16a and the second ground line 24a can be electrically coupled in series by one or more conductive vias 26, while in other embodiments (FIG. 5) the first ground line 16 and the second ground line 24 can be coupled in parallel by one or more conductive vias 26. In any embodiment described herein, the first ground line 16 and the second ground line 24 can be interruptibly, electrically coupled.

Figure 7:
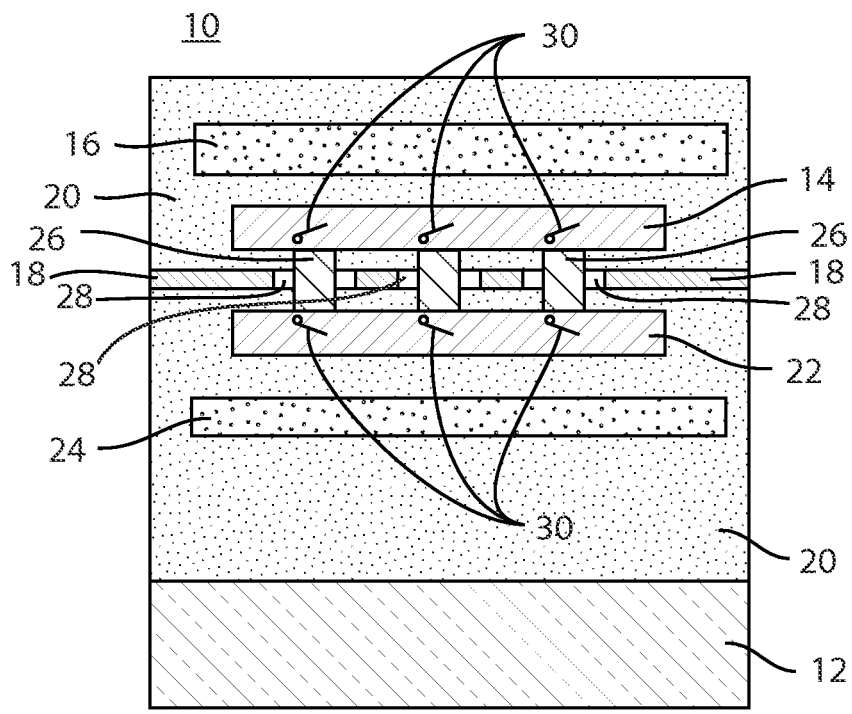
FIG. 7 is a cross-sectional view of a seventh transmission line substructure in accordance with some other embodiments.

As shown in FIGS. 6 & 7, in some embodiments, the transmission line structure 10 can include a second signal line 22 over the substrate 12, where the second substrate 18 is between the first and second signal lines 14, 22, and the first signal line 14 is between the first ground line 16 and the second substrate 18. In some embodiments, the transmission line structure 10 also includes a second ground line 24 and the first and second signal lines 14, 22 are between the first and second ground lines 16, 24.

In some embodiments, such as those shown in FIGS. 6 & 7, the first signal line 14 and the second signal line 22 are electrically coupled. For example, the first signal line 14 and the second signal line 22 can be coupled by a conductive via 26 that passes through the second substrate 18. In order to prevent a short circuit, a substrate dielectric 28 can separate the second substrate 18 from the conductive via 26. The first signal line 14 and the second signal line 22 can be interruptibly, electrically coupled by one or more switches 30.

In some embodiments, such as the one shown in FIG. 6, the first signal line 14 can include a plurality of first signal line segments 14a that are laterally separated from and co-planar with one another. The first signal line segments 14a and the second signal line 22 can be electrically coupled in parallel or in series. The first signal line 14 and the second signal line 22 can be interruptibly, electrically coupled by one or more switches 30. In some embodiments, each of the switches 30 shown in FIGS. 4, 5, 6 and 7 are optional and may be included or excluded depending on the particular design.

In some embodiments, the second signal line 22 includes second signal line segments 22a that are laterally separated from and co-planar with one another. In some embodiments, such as the embodiment shown in FIG. 6, each first signal line segment 14a is electrically coupled to a second signal line segment 22a and the first and second signal line segments 14a, 22a are electrically coupled in series. The first signal line 14 and the second signal line 22 can be interruptibly, electrically coupled by one or more switches 30.

Figure 8:
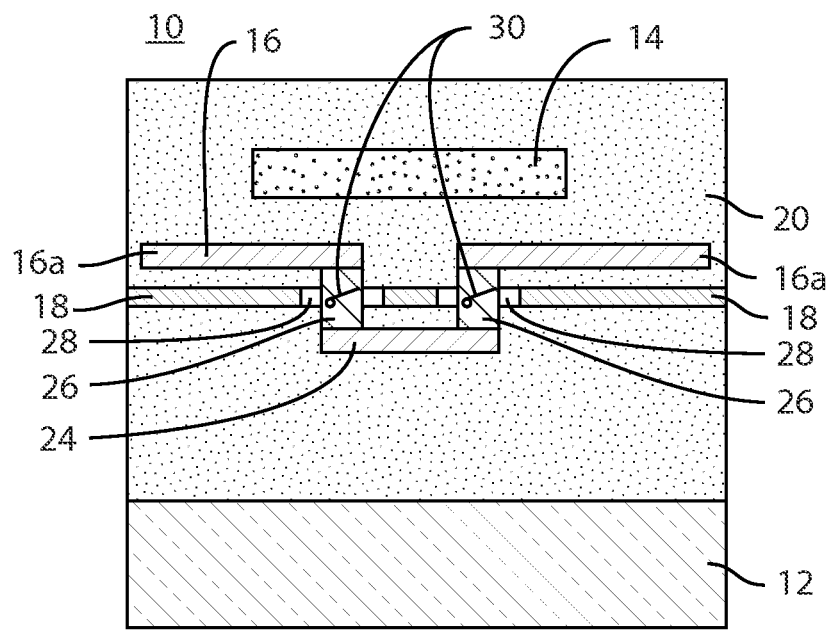
FIG. 8 is a cross-sectional view of an eighth transmission line substructure in accordance with some other embodiments.

One of the benefits of the transmission line substructures 10 with multiple signal lines 14, 22 and/or multiple ground lines 16, 24 is that by changing the electric connection between the coupled lines (14, 22 or 16, 24) it is possible to vary the transmission properties of signals transmitted through the transmission line substructures 10. FIG. 8 shows an embodiment with a signal line 14 over a first and second ground line 16, 24, where the second substrate 18 is between the first and second ground line 16, 24. The first ground line 16 is broken into two ground line segments 16a. Each end of the second ground line 24 is interruptibly, electrically coupled to one of the first ground line segments 16a by a conductive via 26 and a switch 30. In FIG. 8, each of the first signal line 14, the first and second ground lines 16, 24 and the second substrate 18 are vertically separated by at least one electrically insulating layer 20, and all of the components are over the substrate 12.

Figure 9:
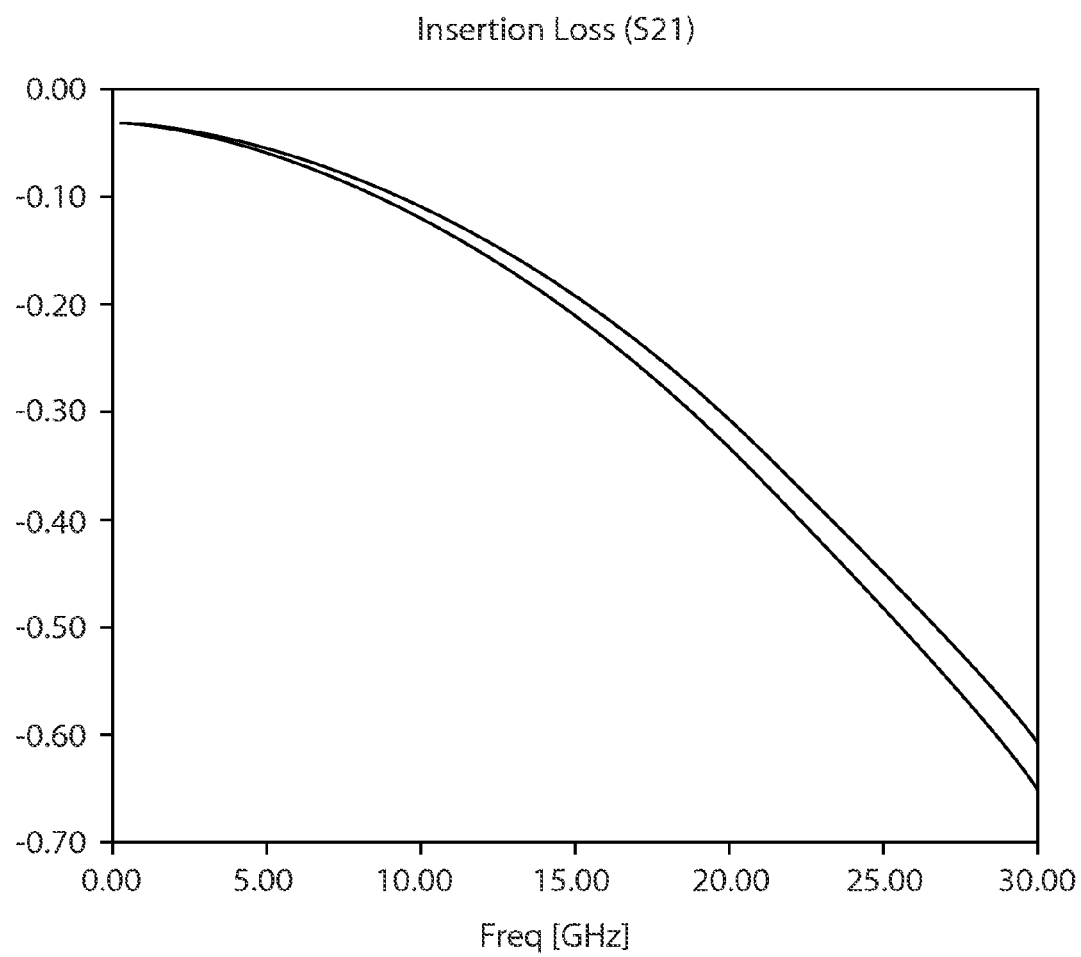
FIG. 9 is a graph showing model results of insertion loss (S21) versus frequency for an embodiment according to FIG. 8.
Figure 10:
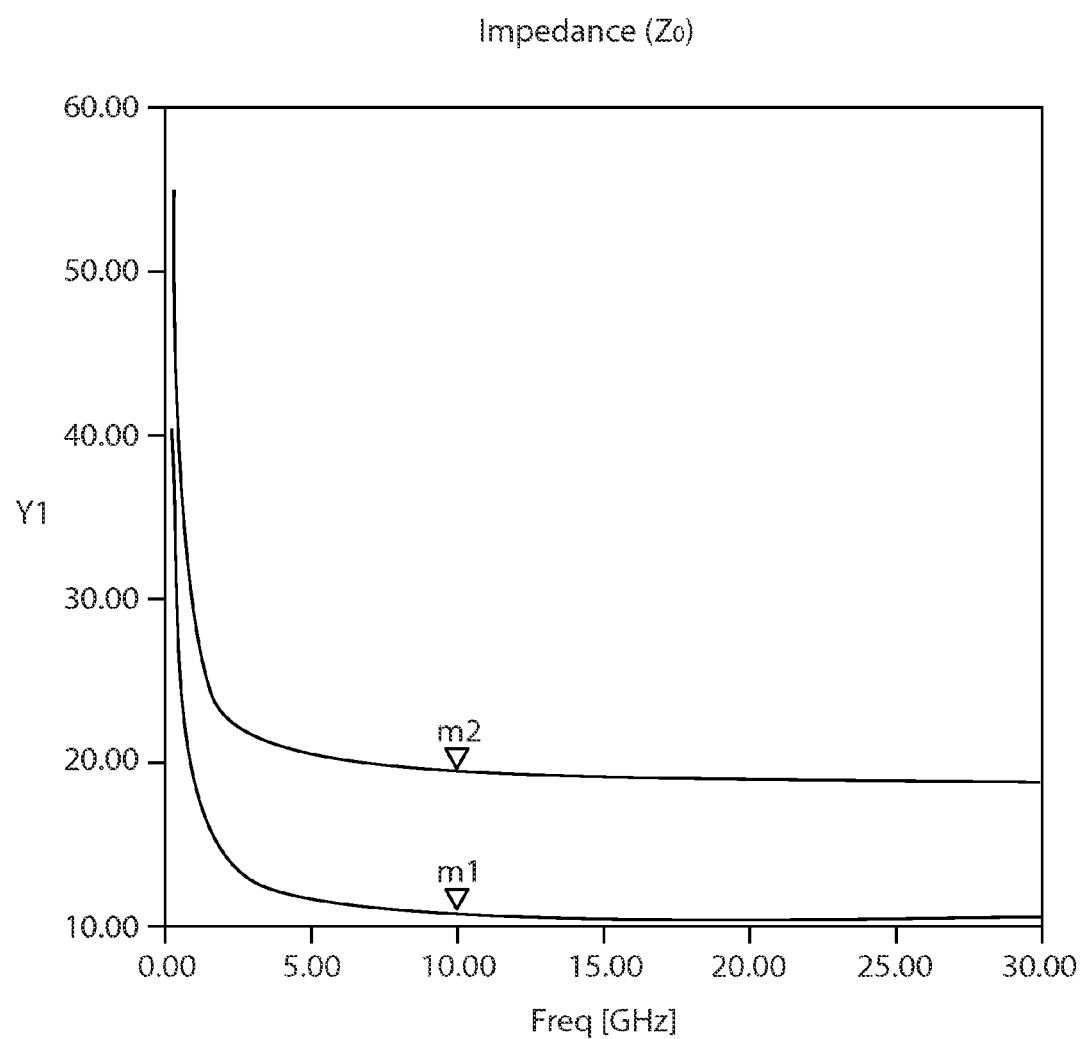
FIG. 10 is a graph showing model results of impedance ($Z_O$) versus frequency for an embodiment according to FIG. 8.
Figure 11:
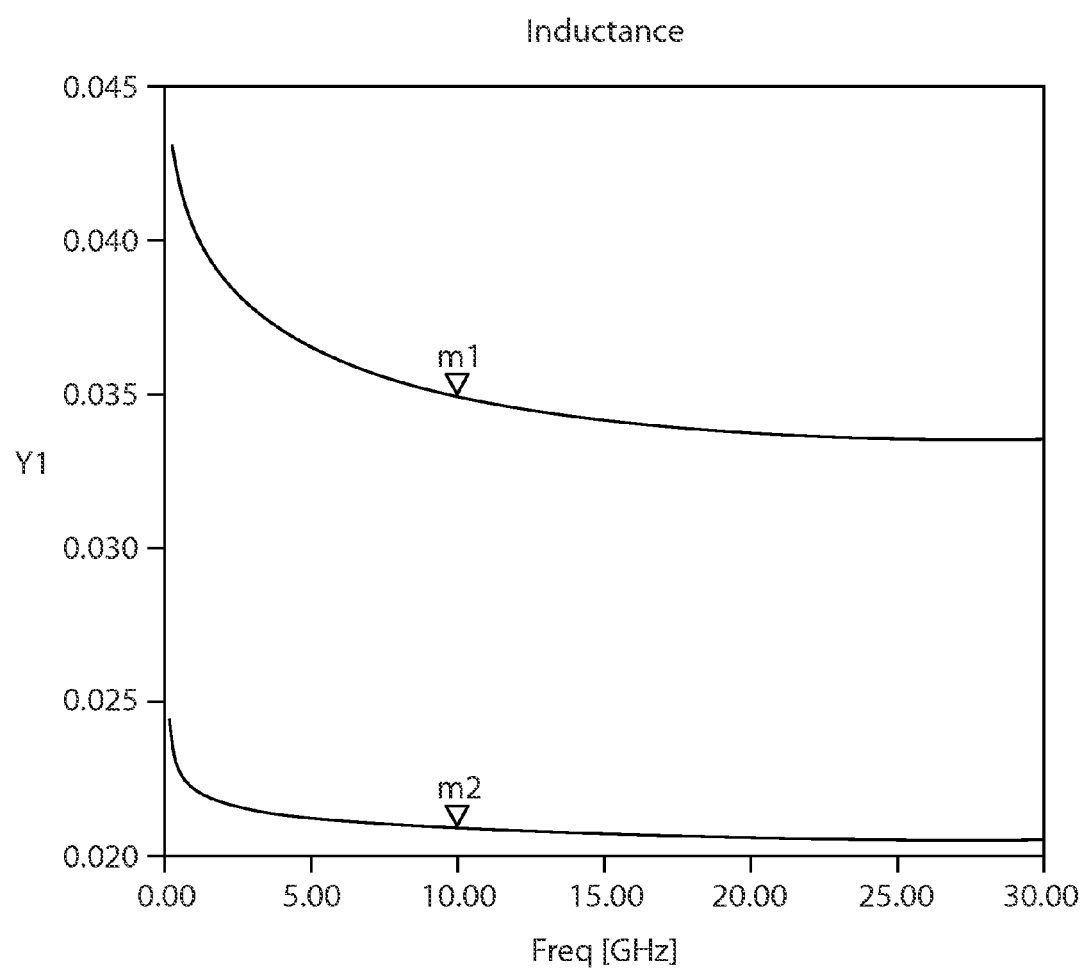
FIG. 11 is a graph showing model results of inductance versus frequency for an embodiment according to FIG. 8.

FIGS. 9-11 show simulation results comparing the transmission line substructure of FIG. 8 when both switches are closed (i.e., the ground lines are all electrically coupled) and when both switches are open (i.e., the ground lines are not coupled to one another). FIG. 9 is a graph of insertion loss (S21 scattering parameter) versus frequency where the top line is with both switches of FIG. 8 closed and the bottom line is with both switches open. FIG. 10 is a graph of impedance ($Z_0$) versus frequency where the top line is with both switches of FIG. 8 closed and the bottom line is with both switches open. FIG. 11 is a graph of inductance versus frequency where the top line is with both switches of FIG. 8 closed and the bottom line is with both switches open. These simulation results demonstrate that it is possible to modify the signal properties, including insertion loss, characteristic impedance, resistance, inductance and capacitance, by changing the switch configuration when first and second signal lines 14, 22 or first and second ground lines 16, 24 are interruptibly, electrically coupled.

In embodiments having first and second signal lines 14, 22, the first and second signal lines 14, 22 can each be coupled to separate signal sources or to the same signal source. In some embodiments, the same signal can be transmitted over the first and second signal lines 14, 22, while different signals can be transmitted over the first and second signal lines 14, 22 in other embodiments. In some embodiments, the same signal is transmitted on all signal line segments 14a, 22a of a particular signal line 14, 22, while different signals can be transmitted on different signal line segments 14a, 22a in other embodiments.

In one embodiment, a semiconductor transmission line substructure 10 is described. The semiconductor transmission line substructure 10 can include a first substrate 12; a first signal line 14 over the substrate 12; a first ground line 16 over the first substrate 12; a second substrate 18 over the first substrate 12; a second signal line 22 over the first substrate 12; and a second ground line 24 over the first substrate 12. Each of the first substrate 12, the first signal line 14, the first ground line 16, the second signal line 22, the second ground line 24, and the second substrate 20 can be vertically spaced apart from one another. The second substrate 20 can be between the first and second signal lines 14, 22, and the second substrate 20 can be between the first and second ground lines 16, 24. Either the first and second signal lines 14, 22 can be electrically coupled or the first and second ground lines 16, 24 can be electrically coupled. Each of the first signal line 14, the first ground line 16, the second signal line 22, the second ground line 24, and the second substrate 18 are separated by at least one electrically insulating layer 20. The electrical coupling can be permanent, electrical coupling or interruptible, electrical coupling using the structures described herein (e.g., switches, conductive vias, etc.).

Figure 13:
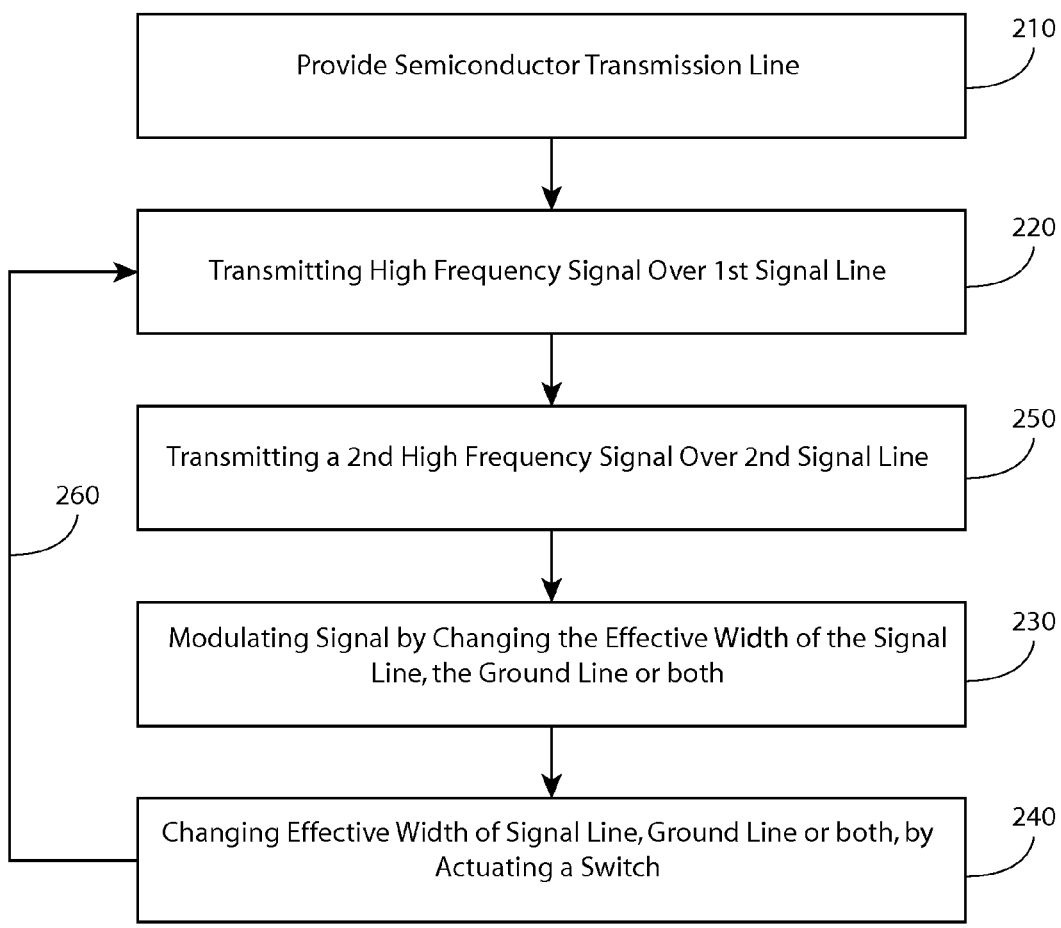
FIG. 13 is a flow chart showing a method in accordance with one embodiment.

In another embodiment, such as that shown in FIG. 13, a method of transmitting a transmission signal is also provided. In step 210, the method can include providing any of the semiconductor transmission line substructures as described herein. The method can also include transmitting a high frequency signal (e.g., a radio or microwave frequency signal) over the signal line, as in step 220. In some embodiments, as shown in step 230, the method can include modulating the signal by changing the effective width of the signal line 14, 22, the ground line 16, 24, or both.

The first signal line 14 can include a plurality of first signal line segments 14a that are separated from and coplanar with one another. In step 240, in some embodiments, the method can include changing an effective width of the first signal line by actuating a switch 30 electrically coupling two adjacent signal line segments 14a, 22a. The switch 20 can be at least one transistor formed in the second semiconductor substrate 18.

As used herein, "effective width" refers to the width of the line segments 14a, 16a, 22a, 24a electrically coupled to one another at a given moment in time. Thus, if a plurality of line segments are interruptibly coupled by switches with all of the switches open, the effective width is the width of an individual line segment, while the effective width would be the width from the left-most segment to the right-most segment if the switches are all closed.

In some embodiments, the semiconductor transmission line substructure 10 includes a second signal line 22 over the substrate 12, where the second substrate 18 is between the first and second signal lines 14, 22. As shown in step 250, in some embodiments, the method can include transmitting a second high frequency signal over the second signal line 22 in some embodiments. The method can include repeating any or all of steps 220, 230, 240 & 250, as shown in step 260.

Figure 12:
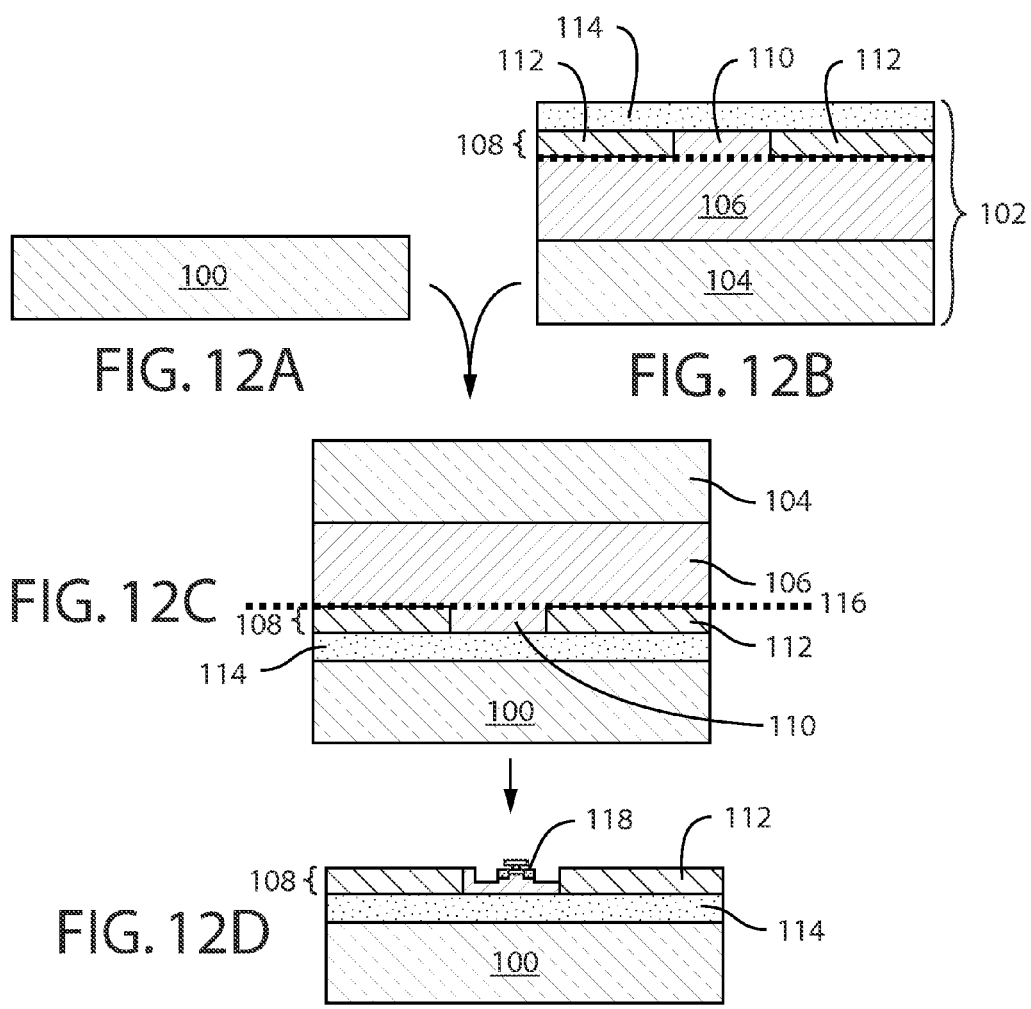
FIG. 12(a)-(d) are cross-sections showing intermediate steps in a process for making an electrically insulating layer that includes circuitry and conductive interconnect structures.

As noted above, the electrically insulating layers 20 can include circuitry and conductive traces/routings. FIG. 12 shows cross-sectional views of a shallow trench isolation (STI) process for producing an electrically insulating layer 20 with such circuitry and conductive tracings/routings. FIG. 12(a) shows an intermediate structure 100 to which the electrically insulating layer will be applied. FIG. 12(b) shows a die 102 having a base substrate 104, and a bulk semiconductor layer (e.g., SiGe or silicon) 106 over the base substrate 104, a structured semiconductor layer 108 over the bulk semiconductor layer 106. The structured semiconductor layer 108 can include a semiconductor block 110 disposed between a dielectric material 112. A glue oxide layer 112 is disposed over the structured semiconductor layer 108. The glue oxide layer 112 functions as a dielectric material.

The die 102 can then be inverted, placed over the intermediate structure 100, and then heated causing the glue oxide layer 112 to adhere to the intermediate structure 100, as shown in FIG. 12(c). The die 102 can then be separated along separation plane 116 using stress (e.g., shear stress) and then further processed to produce the structure shown in FIG. 12(d). For example, as shown in FIG. 12(d), semiconductor block 110 can be processed to form a gate structure 118. When an electrically insulating material layer is deposited over the structure of FIG. 12(d), the layer formed from the bottom of the glue oxide layer 114 and the electrically insulating material layer will function as an electrically insulating layer 20.

In one embodiment, a semiconductor transmission line substructure is disclosed. The semiconductor transmission line can include a first semiconductor substrate; a first signal line over the first semiconductor substrate; a first ground line over the first semiconductor substrate; and a second semiconductor substrate over the first semiconductor substrate.

Each of the first semiconductor substrate first signal line, the first ground line and the second semiconductor substrate are vertically spaced apart from one another.

In some embodiments, a lateral width of the first ground line is at least two times a lateral width of the first signal line.

In some embodiments, the first semiconductor substrate comprises crystalline silicon.

In some embodiments, the second semiconductor substrate comprises silicon.

In some embodiments, the second semiconductor substrate is between the first signal line and the first ground line.

In some embodiments, the second semiconductor substrate is over the first signal line and the first ground line.

In some embodiments, the first signal line and the first ground line are over the second semiconductor substrate.

In some embodiments, the first signal line, the first ground line and the second semiconductor substrate are separated from each other by at least one electrically insulating layer.

In some embodiments, the semiconductor transmission line structure also includes a second signal line over the first semiconductor substrate, wherein the second semiconductor substrate is between the first and second signal lines, and the first signal line is between the first ground line and the second semiconductor substrate.

In such embodiments, the first signal line and the second signal line can be electrically coupled to each other.

In such embodiments, the first signal line can include a plurality of first signal line segments, where the first signal line segments are separated from and co-planar with one another, and where the first signal line segments and the second signal line are electrically coupled in series.

In such embodiments, the second signal line can include a plurality of second signal line segments, where the second signal line segments are separated from and co-planar with one another, where each first signal line segment is electrically coupled to a second signal line segment, and where the first and second signal line segments are electrically coupled in series.

In some embodiments, the semiconductor transmission line structure can also include a second ground line over the first semiconductor substrate, where the second semiconductor substrate is between the first and second ground lines, and the first ground line is between the first signal line and the second semiconductor substrate.

In some embodiments, the first ground line and the second ground line can be electrically coupled to each other.

In such embodiments, the first ground line can include a plurality of first ground line segments, where the first ground line segments are separated from and co-planar with one another, and where the first ground line segments and the second ground line are electrically coupled in series.

In another embodiment, the semiconductor transmission line substructure includes a first semiconductor substrate; a first signal line over the first semiconductor substrate; a first ground line over the first semiconductor substrate; a second semiconductor substrate over the substrate; a second signal line over the first semiconductor substrate; and a second ground line over the first semiconductor substrate. Each of the first semiconductor substrate, the first signal line, the first ground line, the second signal line, the second ground line, and the second semiconductor substrate are vertically spaced apart from one another. In such embodiments, the second semiconductor substrate can be between the first and second signal lines, the second semiconductor substrate can be between the first and second ground lines, and either the first and second signal lines are electrically coupled or the first and second ground lines can be electrically coupled.

In another embodiment, a method of transmitting a transmission signal is provided. The method includes providing a semiconductor transmission line substructure, and transmitting a high frequency signal over a first signal line of the semiconductor transmission line. The semiconductor transmission line substructure can includes a first semiconductor substrate, a signal line over the first semiconductor substrate, a ground line over the first semiconductor substrate, and a second semiconductor substrate over the substrate, wherein each of the first semiconductor substrate, the first signal line, the first ground line and the second semiconductor substrate are vertically spaced apart from one another.

In some embodiments, the method includes modulating the signal by changing an effective width of the first signal line, the first ground line or both.

In some embodiments, the first signal line includes a plurality of first signal line segments, where the signal ground line segments are separated from and co-planar with one another, and the method include changing an effective width of the first signal line by actuating a switch electrically coupling two adjacent signal line segments.

In such embodiments, the switch can be at least one transistor formed in the second semiconductor substrate.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A semiconductor transmission line substructure comprising:
   a first semiconductor substrate;
   a first signal line over said first semiconductor substrate;
   a first ground line over said first semiconductor substrate;
   a second semiconductor substrate over said first semiconductor substrate, wherein each of said first semiconductor substrate, said first signal line, said first ground line and said second semiconductor substrate are vertically spaced apart from one another, and
   a second ground line over said first semiconductor substrate, wherein said second semiconductor substrate is between said first and second ground lines.

2. The semiconductor transmission line structure as in claim 1, wherein a lateral width of said first ground line is at least two times a lateral width of said first signal line.

3. The semiconductor transmission line structure as in claim 1, wherein said first semiconductor substrate comprises crystalline silicon.

4. The semiconductor transmission line structure as in claim 1, wherein said second semiconductor substrate comprises silicon.

5. The semiconductor transmission line structure as in claim 1, wherein said second semiconductor substrate is between said first signal line and said first ground line.

6. The semiconductor transmission line structure as in claim 1, wherein said second semiconductor substrate is over said first signal line and said first ground line.

7. The semiconductor transmission line structure as in claim 1, wherein a second signal line and said second ground line are over said second semiconductor substrate.

8. The semiconductor transmission line structure as in claim 1, wherein said first signal line, said first ground line and said second semiconductor substrate are separated from each other by at least one electrically insulating layer.

9. The semiconductor transmission line structure as in claim 1, further comprising:
   a second signal line, wherein said second semiconductor substrate, said first ground line, and said second ground line are between said first and second signal lines.

10. The semiconductor transmission line structure as in claim 9, wherein said first signal line and said second signal line are electrically coupled to each other.

11. The semiconductor transmission line structure as in claim 10, wherein said first signal line comprises a plurality of first signal line segments, wherein said first signal line segments are separated from and co-planar with one another, wherein said first signal line segments and said second signal line are electrically coupled in series.

12. The semiconductor transmission line structure as in claim 11, wherein said second signal line comprises a plurality of second signal line segments, wherein said second signal line segments are separated from and co-planar with one another, wherein each first signal line segment is electrically coupled to a second signal line segment and said first and second signal line segments are electrically coupled in series.

13. The semiconductor transmission line structure as in claim 1, wherein said first ground line is between said first signal line and said second semiconductor substrate.

14. The semiconductor transmission line structure as in claim 13, wherein said first ground line and said second ground line are electrically coupled to each other.

15. The semiconductor transmission line structure as in claim 14, wherein said first ground line comprises a plurality of first ground line segments, wherein said first ground line segments are separated from and co-planar with one another, wherein said first ground line segments and said second ground line are electrically coupled in series.

16. A semiconductor transmission line substructure comprising:
   a first semiconductor substrate;
   a first signal line over said first semiconductor substrate;
   a first ground line over said first semiconductor substrate;
   a second semiconductor substrate over said first semiconductor substrate;
   a second signal line over said first semiconductor substrate; and
   a second ground line over said first semiconductor substrate, wherein each of said first signal line, said first ground line, said second signal line, said second ground line, and said second semiconductor substrate are vertically spaced apart from one another,
   wherein said second semiconductor substrate is between said first and second signal lines,
   wherein said second semiconductor substrate is between said first and second ground lines, and
   wherein said first and second signal lines are electrically coupled or said first and second ground lines are electrically coupled.

17. A method of transmitting a transmission signal, comprising:
   providing a semiconductor transmission line substructure comprising:
   a first semiconductor substrate,
   a first signal line over said first semiconductor substrate,
   a first ground line over said first semiconductor substrate, and
   a second semiconductor substrate over said first semiconductor substrate, wherein each of said first signal line, said first ground line and said second semiconductor substrate are vertically spaced apart from one another; and
   a second ground line over said second semiconductor substrate, wherein said second semiconductor substrate is between said first and second ground lines; and
   transmitting a high frequency signal over the first signal line.

18. The method as in claim 17, further comprising modulating said signal by changing an effective width of said first signal line, said first ground line or both.

19. The method as in claim 17, wherein said first signal line comprises a plurality of first signal line segments, wherein said signal ground line segments are separated from and co-planar with one another, and
   wherein said method further comprising changing an effective width of the signal line by actuating a switch electrically coupling two adjacent signal line segments.

20. The method as in claim 19, wherein said switch comprises at least one transistor formed in the second semiconductor substrate.

* * * * *